United States Patent [19]

Davis

[11] Patent Number: 5,214,307

[45] Date of Patent: May 25, 1993

[54] LEAD FRAME FOR SEMICONDUCTOR DEVICES HAVING IMPROVED ADHESIVE BOND LINE CONTROL

[75] Inventor: Nancy L. Davis, Boise, Id.

[73] Assignee: Micron Technology, Inc., Boise, Id.

[21] Appl. No.: 726,457

[22] Filed: Jul. 8, 1991

[51] Int. Cl.⁵ .............................................. H01L 23/14
[52] U.S. Cl. ................................. 257/676; 257/666;
257/782; 257/783
[58] Field of Search .......................... 357/70, 72, 80;
257/676, 666, 782, 783

[56] References Cited

U.S. PATENT DOCUMENTS 5,081,520  1/1992  Yoshii et al. ........................ 357/68

FOREIGN PATENT DOCUMENTS 0207645  12/1983  Japan ................................ 357/70

Primary Examiner—Rolf Hille
Assistant Examiner—S. V. Clark
Attorney, Agent, or Firm—David J. Paul

[57] ABSTRACT

Described is a lead frame design which allows for greater control of adhesive thickness which bonds the die with the die paddle on the lead frame. A number of bumps on the surface of the lead frame contact the die, thereby keeping the die a controlled distance from the surface of the die paddle. A sufficient amount of adhesive is applied to the die paddle to ensure a minimum allowable contact of the die with the adhesive, and the adhesive with the lead frame. Enough force is applied to the surface of the die to allow contact between the die and the bumps on the surface of the inventive lead frame. The force applied to the surface of the die, therefore, has no effect on the thickness of the bond line, as long as some minimum amount of pressure is applied.

9 Claims, 3 Drawing Sheets

LEAD FRAME FOR SEMICONDUCTOR DEVICES HAVING IMPROVED ADHESIVE BOND LINE CONTROL

FIELD OF THE INVENTION

The present invention relates to the field of semiconductor manufacture. More specifically, a lead frame design is described which allows for improved adhesive bond line control between the semiconductor die and the lead frame.

BACKGROUND OF THE INVENTION

Various types of semiconductor devices are manufactured in much the same way. A starting substrate, usually a thin wafer of silicon or gallium arsenide, is masked, etched, and doped through several process steps, the steps depending on the type of devices being manufactured. This process yields a number of die on each wafer produced. The die are separated with a die saw, and then packaged into individual components.

During the packaging process, several semiconductor die are attached to a lead frame, often with a material such as epoxy or other viscous adhesives. Bond wires couple each of several bond pads on each die to conductive leads on the lead frame. The die, the wires, and a portion of the leads are encapsulated in plastic or encased in ceramic. These leads couple the die with the device into which the component is installed, thereby forming a means of I/O between the die and the device.

One step of semiconductor manufacture that is not without problems is the die-lead frame attachment. During the manufacturing process, several die are attached to the lead frame, wires are connected from the bond pads on each of the die to the "fingers" on the lead frame, then the die is encapsulated in a protective plastic casing. The plastic packages are separated, and the leads are formed into a desired shape. The lead frame, part of which will eventually form the conductive leads of the components, contains a major surface to which the die is attached, called the "paddle." The die is normally bonded to the paddle with epoxy or another viscous adhesive, although thermoplastic, tape, or another materials are also used. FIG. 1 shows a lead frame 10 having die paddles 12 with die 14 attached. The adhesive used to attach the die to the lead frame is dispensed on the die paddle area of the lead frame. The die is placed on the uncured epoxy and held at a specific pressure by die attachment equipment having a surface contact tool or an edge contact only tool (collet). The die is pressed down into the adhesive at a specific pressure by the tool and held in place long enough to ensure adhesion. X-Y movement (scrub) is sometimes used to increase adhesion and to speed the process. The attach process requires a follow-on cure in a separate cure oven.

Various problems are associated with the connection of the die to the die paddle. Occasionally a corner of the die will crack, thereby making the semiconductor inoperable. This can result from stress placed upon the die by the adhesive due to an uneven thermal coefficient of expansion between the die and the adhesive. After the die is attached to the lead frame and oven cured, the assembly is heated at the wire bond step to attach the wire to the die pad. If the die and the adhesive expand at different rates, undue stresses can be inflicted on the die thereby causing the corner to crack. Corner crack can also occur from stress on the die due to shrinkage of the adhesive as it cures, although in recent years chemical improvements in adhesive has reduced this cause of corner crack.

Occasionally the die and epoxy may come loose from the lead frame, a problem referred to as "popping die." Popping die can result from too little adhesive under the die, a poor bond between the adhesive and the paddle, or from bowing of the die paddle from heat or pressure. This can be a serious problem, not only because it results in scrapping the die but also because the loose die can damage the molds which are used to encapsulate the package. A single popping die can presently cost as much as $11,000 in damaged equipment.

Many of the problems associated with the die-lead frame attachment are thought to result to varying degrees from package stresses caused by nonuniformity in the thickness (the "bond line") of the adhesive which bonds the die to the lead frame paddle. This thickness has been controlled mainly by dispensing a measured quantity of adhesive then applying a controlled pressure for a specific time to the die by the die attacher. The bond line is difficult to control in this manner, and can vary greatly with small variations in the viscosity of the adhesive, application temperature, amount of applied adhesive, and other factors. If not enough adhesive is applied to the die paddle or too little pressure is applied to the die, a good bond between the die and lead frame cannot be ensured because of voids in the adhesive under the die. If too much adhesive or pressure is applied, the bond may be strong but too much of the adhesive will ooze out from under the die (resin bleed) and can prevent a good coupling between the bond wire and the bond pad on the top surface of the die. "Wet out" refers to the adhesive which seeps out from under the die, and the "fillet height" is the height reached by the adhesive which seeps out. A good bond will have 100% wet out but a very low fillet height, which helps prevent resin bleed and popping die from too little of a bond line. FIG. 2 shows a die 14 attached to a lead frame 10 by an adhesive 20, with a good wet out and fillet 22. FIG. 3 shows a die 14 attached to a lead frame 10 by an adhesive 20, with a poor wet out (voids 30 beneath the die 14) and a fillet 22 which covers the bond pads (not shown) on the top surface of the die 14.

Other methods of controlling the thickness of the adhesive under the die have been tested, with limited success. Manufacturers have attempted to measure the fillet height of the adhesive that oozes out from beneath the die as pressure is applied to the die and cease applying pressure to the die as soon as the fillet reaches a certain height. Adhesives with solid suspended "microbeads" have been manufactured in the attempt to control the bond line. Lead frames have been manufactured with dimples which collect excess adhesive as pressure is applied and therefore helps relieve stress which might otherwise bow the package.

A reliable method of controlling the bond line thickness which would help reduce or eliminate the various problems describe above would reward chip manufacturers reduced costs from scrap and damaged equipment.

SUMMARY OF THE INVENTION

An object of this invention is to provide an improved lead frame design which will allow for greater control of adhesive thickness (bond line) between the die and the lead frame.

Another object of this invention is to provide an improved lead frame design which will reduce die corner crack as a result of its greater control over the bond line.

Another object of this invention is to provide an improved lead frame design which will reduce popping die as a result of its greater control over the bond line.

Still another object of this invention is to provide an improved lead frame design which will reduce the manufacturing costs associated with failures of die-lead frame attachment which occur because of poor control of adhesive bond line.

Another object of this invention is to provide an improved lead frame design which will increase the uniformity of the bond line thickness between assemblies.

These objects of the present invention are accomplished by providing raised areas on the surface of the lead frame paddle which will contact the bottom surface of the die and allow for a uniform thickness of adhesive underneath the die. To attach the die to the lead frame, a measured quantity of adhesive will be dispensed on the die paddle, and the die attach equipment will seat the die onto the die paddle with a measured force. This force will be sufficient to ensure contact of the die with the bumps on the surface of the inventive lead frame, but not so great to damage the die.

In contrast with previous lead frame designs, the thickness of the bond line is not dependent on the amount and duration of force applied to the die by the die attach equipment, as long as the force is sufficient to contact the die with the bumps on the inventive lead frame. The invention allows a more uniform adhesive thickness underneath a single die, and further allows a more uniform adhesive thickness between any number of die. The uniformity of adhesive thickness between assemblies is limited only by the ability to control the uniformity of the bumps on the die paddle.

DETAILED DESCRIPTION OF THE INVENTION

Figure 1:
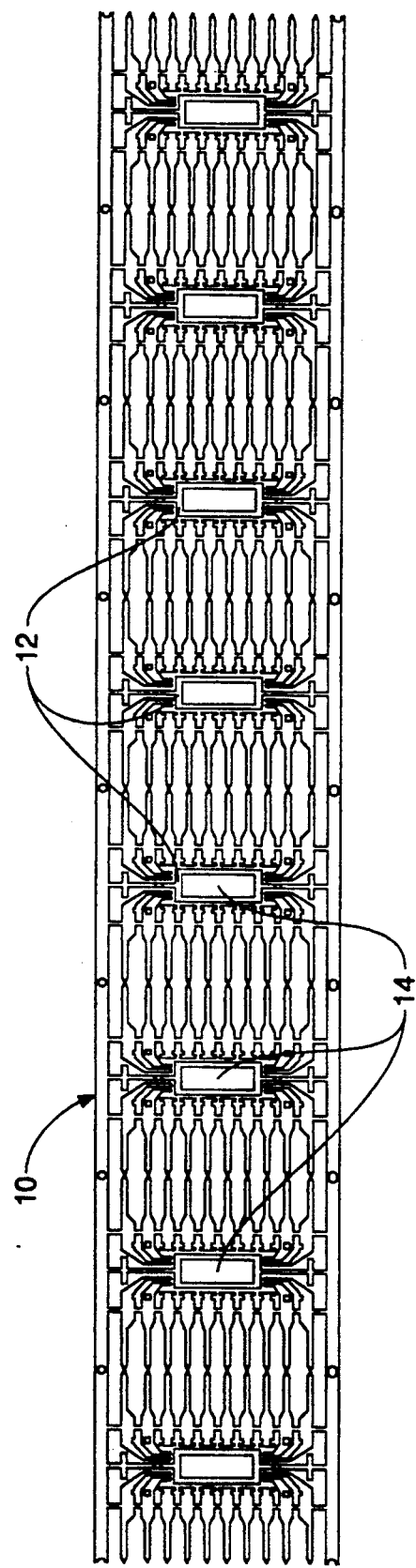
FIG. 1 is a top view of a lead frame having die paddles and semiconductor die attached.
Figure 2:
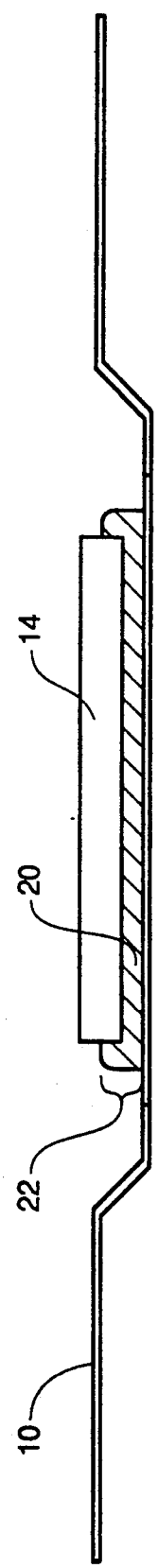
FIG. 2 is a cross section of a die attached to a lead frame with adhesive, the adhesive having a good bond line.
Figure 3:
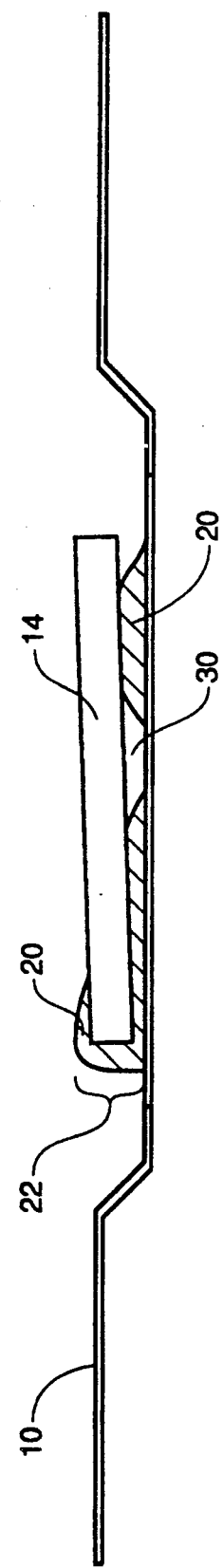
FIG. 3 is a cross section of a die attached to a lead frame with adhesive, the adhesive having a poor bond line.
Figure 4:
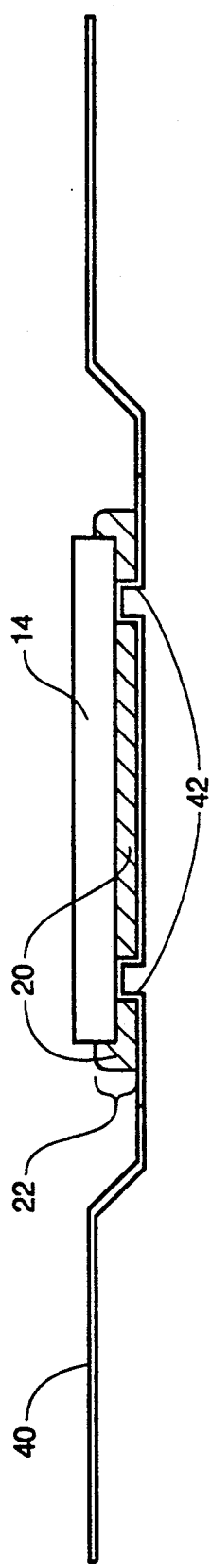
FIG. 4 is a side view of a die attached to an inventive lead frame.

FIG. 4 is a side view of one embodiment of the inventive lead frame 40 having bumps 42 which contact the die 14 and provide for a uniform fillet 22 of adhesive 20.

The bumps on the lead frame can be manufactured by stamping or etching them into the metal of the lead frame during the lead frame manufacturing process, or the bumps can be metal or other material adhered to the surface of the lead frame.

The bumps can be of any height and size, but should not be so large so as to decrease significantly the surface area contact between the die and the adhesive. The height of the bump will determine the bond line, which is usually $\approx 1$ to 2 mils, although bond lines of up to 5 mils are not uncommon. In general, the bumps should reduce the adhesive-die surface area by no more than 10% to ensure a strong bond, although this depends somewhat on the efficiency of a particular adhesive.

The bumps can also be of any shape. A rounded bump would decrease the surface area contact between the die and the adhesive less than a flat surface. Note, however, that excess stress may be placed upon the die as force is being applied to the die surface by the attach equipment if the top of the bumps have too small of a surface area, such as an inverted cone.

Figure 5:
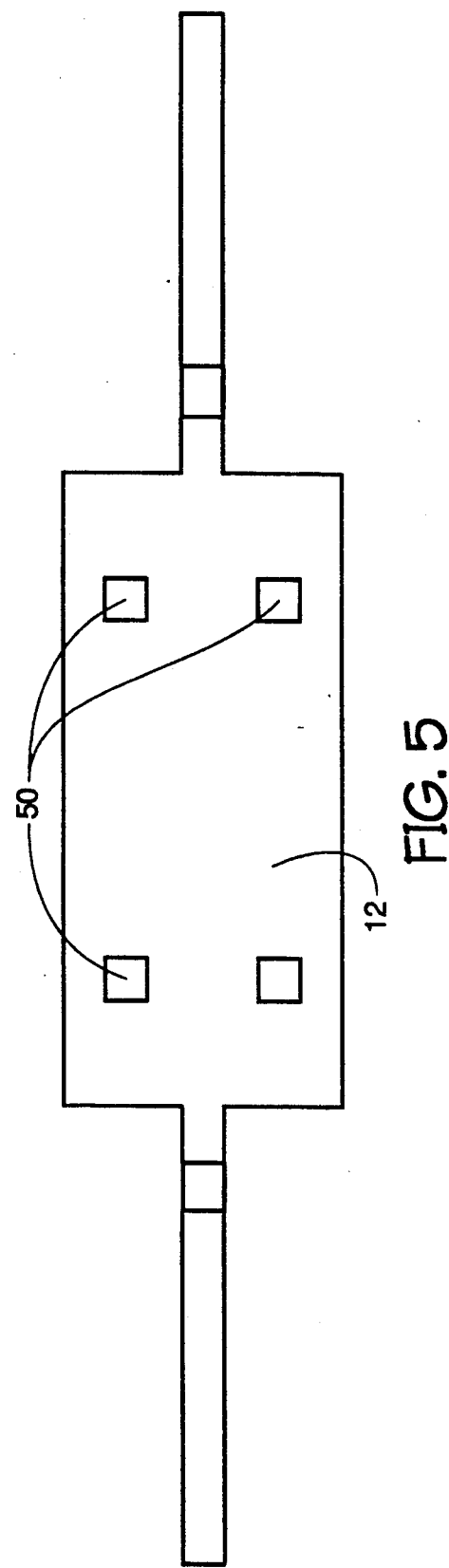
FIG. 5 is a top view of an inventive lead frame.

The paddle can contain any number of bumps, as long as they are balanced so that the die cannot rock, and so that the die-adhesive surface area is not reduced significantly. The bumps should be placed to ensure that the die remains parallel (level) with respect to the paddle surface for easier bonding processing. Also, the position and number of bumps will determine the stress placed on the die as it is being attached by the die attach equipment. FIG. 5 shows one possible configuration of bumps 50 on the paddle 12. A similar configuration, except a center bump to further support the center area of the die, may have advantages.

What have been described are specific configurations of the invention, as applied to particular embodiments. Clearly, variations can be made to the original designs described in this document for adapting the invention to other embodiments. For example, the size, shape, and number of bumps on the surface of the inventive lead frame can vary depending on each individual design. Also, the bumps can be stamped or etched during the manufacture of the lead frame, applied to the die paddle by adhesive means such as epoxy, solder, thermoplastic, or any other workable means. Finally, uses of the bumps to prevent contact of the die with a major surface other than as used with a lead frame can be conceived by one of ordinary skill in the art. Therefore, the invention should be read as limited only by the appended claims.

I claim:

1. A semiconductor device having a substrate for receiving a semiconductor die, said semiconductor device comprising:
    a) a major surface of said substrate;
    b) bumps on said major surface of said substrate and extending from said major surface of said substrate a distance of 5 mils or less such that said bumps prevent the semiconductor die from resting directly on said major surface; and
    c) an adhesive which contacts a major surface of said die and said major surface of said substrate, wherein said bumps reduce said contact between said die and said adhesive by 10% or less.

2. The semiconductor device of claim 1 wherein said substrate comprises four bumps positioned so that each quadrant of the semiconductor die is supported substantially by a different bump.

3. A substrate for receiving a semiconductor die, comprising:
    a) a major surface; and
    b) bumps on said major surface of said substrate and extending from said major surface of said substrate a distance of 5 mils or less such that said bumps prevent the semiconductor die from resting directly on said major surface; whereby an adhesive which contacts a major surface of said die and said major surface of said substrate reduces said contact between said die and said adhesive by 10% or less.

4. The substrate of claim 3 wherein said substrate comprises four bumps positioned so that each quadrant of the semiconductor die is supported substantially by a different bump.

5. A lead frame for receiving a semiconductor die, comprising:
 a) a die paddle; and
 b) bumps on said die paddle and extending from said die paddle a distance of 5 mils or less such that said bumps prevent the semiconductor die from resting directly on said die paddle, whereby an adhesive which contacts a major surface of said die and said major surface of said substrate reduces said contact between said die and said adhesive by 10% or less.

6. The lead frame of claim 5 wherein said lead frame comprises four bumps positioned so that each quadrant of the semiconductor die is supported substantially by a different bump.

7. The semiconductor device of claim 1 wherein said adhesive acquires a thickness approximately equal to said distance said bumps extend from said major surface of the substrate when the semiconductor die contacts said bumps.

8. The semiconductor device of claim 3 wherein said adhesive acquires a thickness approximately equal to said distance said bumps extend from said major surface of the substrate when the semiconductor die contacts said bumps.

9. The lead frame of claim 5 wherein said adhesive acquires a thickness approximately equal to said distance said bumps extend from said die paddle when the semiconductor die contacts said bumps.

* * * * *